United States Patent
Childress et al.

(10) Patent No.: US 7,411,765 B2
(45) Date of Patent: Aug. 12, 2008

(54) CPP-GMR SENSOR WITH NON-ORTHOGONAL FREE AND REFERENCE LAYER MAGNETIZATION ORIENTATION

(75) Inventors: Jeffrey Robinson Childress, San Jose, CA (US); Neil Smith, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 473 days.

(21) Appl. No.: 11/189,170

(22) Filed: Jul. 25, 2005

(65) Prior Publication Data
US 2007/0019338 A1    Jan. 25, 2007

Related U.S. Application Data

(60) Provisional application No. 60/700,549, filed on Jul. 18, 2005.

(51) Int. Cl.
*G11B 5/127* (2006.01)
(52) U.S. Cl. .................................. 360/324.1

(58) Field of Classification Search ............ 360/324.12, 360/324.11, 324.1, 324.2
See application file for complete search history.

(56) References Cited

U.S. PATENT DOCUMENTS

| | | | |
|---|---|---|---|
| 6,262,869 B1 * | 7/2001 | Lin et al. | 360/324.11 |
| 2005/0068688 A1 * | 3/2005 | Sbiaa et al. | 360/324.1 |
| 2007/0063237 A1 * | 3/2007 | Huai et al. | 257/295 |

* cited by examiner

*Primary Examiner*—Allen T Cao
(74) *Attorney, Agent, or Firm*—Zilka-Kotab, PC

(57) ABSTRACT

A CPP GMR sensor structure having free and reference layers, where the magnetic orientations of the free and reference layers are non-orthogonal. In one embodiment, a ferromagnetic free layer film has a bias-point magnetization nominally oriented in plane of the film thereof, in a first direction at an angle $\theta_{fb}$ with respect to a longitudinal axis being defined as the intersection of the plane of deposition of the free layer and the plane of the ABS. A ferromagnetic reference layer film has a bias-point magnetization nominally oriented in a plane of the film thereof, in a second direction at angle $\theta_{rb}$ with respect to said longitudinal axis that is not orthogonal to the said first direction.

32 Claims, 12 Drawing Sheets

CPP-GMR SENSOR WITH NON-ORTHOGONAL FREE AND REFERENCE LAYER MAGNETIZATION ORIENTATION

RELATED APPLICATIONS

This application claims priority to U.S. Provisional Patent Application Ser. No. 60/700,549, filed Jul. 18, 2005 and entitled "Thermal and Spin-Torque Noise in CPP (TMR and/or GMR) Read Sensors" to Smith et al. and which is herein incorporated by reference.

FIELD OF THE INVENTION

The present invention relates to magnetic heads, and more particularly, this invention relates to a Current-Perpendicular-to-Plane (CPP) Giant Magnetoresistance (GMR) head having nonorthogonal alignment of free and reference layer magnetizations.

BACKGROUND OF THE INVENTION

The heart of a computer is a magnetic disk drive which includes a rotating magnetic disk, a slider that has read and write heads, a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

Magnetoresistive (MR) read sensors, commonly referred to as MR heads, are used in all high capacity disk drives. An MR sensor detects a magnetic field through the change in its resistance as a function of the strength and direction of the magnetic flux being sensed by the MR layer. The standard type of MR sensor in today's disk drives employs the giant magnetoresistive (GMR) effect, such that the resistance varies as a function of the spin-dependent transmission of the conduction electrons between two or more ferromagnetic layers separated by a non-magnetic spacer layers, and the accompanying spin-dependent scattering which takes place at the interface of the ferromagnetic and non-magnetic layers and within the ferromagnetic layers. The resistance of these sensors depends on the relative orientation of the magnetization of the different magnetic layers.

GMR sensors whose resistance depends primarily on the relative magnetization of only two layers of ferromagnetic material (e.g., Ni—Fe) separated by a layer of non-magnetic material (e.g., Cu) are generally referred to as spin valve (SV) sensors. In a "simple", SV sensor, one of the ferromagnetic layers, referred to as the reference layer (or pinned layer), has its magnetization typically pinned by exchange coupling with an antiferromagnetic (e.g., PtMn) layer. The pinning field generated by the antiferromagnetic layer should be sufficiently large to ensure that the magnetization direction of the reference layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). U.S. Pat. No. 5,206,590 granted to Dieny et al., incorporated herein by reference, discloses a "simple" SV sensor operating on the basis of the GMR effect.

An exemplary high performance read head employs a spin valve sensor for sensing the magnetic signal fields from the rotating magnetic disk. FIG. 1A shows a prior art SV sensor 100 comprising a free layer (free ferromagnetic layer) 110 separated from a reference layer (pinned ferromagnetic layer) 120 by a non-magnetic, electrically-conducting spacer layer 115. The magnetization of the reference layer 120 is fixed by exchange pinning to an antiferromagnetic (AFM) layer 130.

FIG. 1B shows a perspective view of the SV sensor 100 of FIG. 1A.

Almost universally employed in present day SV sensors is the use is the use of antiparallel (AP)-pinning. In such AP-pinned SV sensors, the reference layer is a laminated structure of two ferromagnetic layers separated by a non-magnetic AP-coupling layer such that the magnetizations of the two ferromagnetic layers are strongly coupled together antiferromagnetically in an antiparallel orientation. The first ferromagnetic layer, referred to as the pinned layer, has its magnetization pinned/fixed in orientation by direct exchange coupling to an AFM layer. The second ferromagnetic layer serves as the reference layer in determining the resistance of the device, is strongly AP-coupled to the pinned layer, and by effect is also fixed in orientation. The cancellation of magnetic moment and demagnetizing fields of the AP-aligned pinned and reference layers greatly improves the stability of the reference layer relative to that obtained for the simple SV sensor of FIG. 1A.

Referring to FIG. 1C, an AP-Pinned SV sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic (pinned) layer 226 and a second ferromagnetic (reference) layer 222 separated by an antiparallel coupling layer (APC) 224 of nonmagnetic material. The two ferromagnetic layers 226, 222 ($FM_1$ and $FM_2$) in the laminated AP-pinned layer structure 220 have their magnetization directions oriented antiparallel, as indicated by the arrows 227, 223 (arrows pointing out of and into the plane of the paper respectively).

Variations of the resistance R of the spin valve sensor are known to be a linear function of $Q=\cos(\theta)$, where $\theta$ is the angle between the (in-plane) magnetization vectors of the reference and free layer structures. Specifically, $\theta \equiv \theta_f - \theta_r$, where $\theta_f$ is the angle of (in-plane) magnetization of the free layer and $\theta_r$ represents the angle of (in-plane) magnetization of the reference layer. The sensitivity of the sensor is quantified by its magnetoresistive coefficient $\Delta R/R_0$, where $\Delta R = R_{max} - R_{min}$ the maximum change in the resistance of the sensor, and $R_0 = R(Q=0)$ is the resistance of the sensor when the magnetic moments are orthogonal. It is virtually always the case in SV sensors as practiced in the art that $R_{max} = R(Q=-1) = R(\theta=180°)$ and $R_{min} = R(Q=+1) = R(\theta=0)$.

In operation, the SV sensor is subjected to positive and negative magnetic signal fields $H_{sig}$ from a moving magnetic disk. These positive and negative signal fields are typically equal in magnitude, and oriented orthogonal to the plane of the disk (or ABS plane). It is desirable that positive and negative changes in the resistance of the spin valve read head be equal so that the positive and negative readback signals are equal.

When the direction of the magnetic moment of the pinned/reference layer structures are exchange pinned perpendicular to the ABS, i.e., such that $\theta_r=\pm 90°$, then $Q=\pm\sin(\theta_f)$, where $\theta_f$ is measured from an axis mutually parallel to the planes of the free layer and the ABS. Since $R(Q)$ is linear with variation of Q, it follows that $R_0=R(Q=0)=R(\theta_f=0)$ will be exactly midway between $R_{max}=R(Q=-1)$ and $R_{min}=R(Q=+1)$.

It is further well known magnetically that the rotation of the free layer magnetization angle $\theta_f$ in response to magnetic signal fields from the disk, is such that $\sin(\theta_f)$ will vary approximately linearly with the amplitude of the signal field $H_{sig}$. This is particularly true if $\theta_{fb}=0$ is approximately the (quiescent) bias-point orientation of the free layer in the absence of signal fields, in which case the sensitivity $d(\sin(\theta_f)/dH_{sig}$ is also generally maximized. It follows that the optimum bias point configuration: $\theta_r\cong\pm 90°$, $\theta_{fb}=0°$ will concurrently maximize both the small signal sensitivity and linear dynamic range SV sensor, while simultaneously minimizing the asymmetry in resistance change $R(H_{sig})-R_0$ with respect to the polarity of signal field $H_{sig}$. These design considerations for optimized SV sensor performance are illustrated in FIGS. 2A-2B, and are well known in the prior and present day art for CIP sensors.

The location on the transfer curve of the actual bias point is influenced by several major factors. These include demagnetizing fields, both intralayer (shape anisotropy), and mutual interlayer dipolar coupling, combined with interfacial coupling fields between the free and reference/pin layers, the pinning field strength $H_{pin}$ exerted on the pinned layer by exchange coupling to the AFM to maintain $\theta_r\cong\pm 90°$, and, a longitudinal bias field $H_{LB}$ (typically supplied by layers of permanent, hard magnet material contiguous to the track edges of the SV sensor), to stabilize the free layer magnetization in a quiescent/bias state with $\theta_{fb}\cong 0°$ Given the inevitable anisotropic stress relief at the lapped, ABS edge of the sensor, stress-induced magnetic anisotropy due to nonzero magnetostriction in any of these magnetic layers may also play a role.

The above descriptions of SV sensors apply primarily to what are known in the art as Current-in-Plane (CIP) spin-valve sensors (CIP-SV), in which the bias current flows primarily in the plane of all constituent layers of the SV structure. CIP-SV sensors have been at the core of HDD read head technology for over one decade. For all such devices, the bias current is injected into the sensor through metallic conductive layers (which may include the aforementioned hard bias films) which form a junction with the sensor at the edges which define its physical track-width (TT). Like the sensor itself, the metallic lead structures must be contained within, and maintained electrically insulated from, the two (lower and upper) magnetic conductive shields (typically NiFe) whose gap length G primarily determines the linear (down-track) resolution capability of the sensor.

As HDD product areal densities exceed 100 Gbit/sq. in., the size of G, TW, and sensor stripe height SH (with $SH\approx TW$ typically) are all necessarily being decreased to below 100 nm size. These small SH, combined with constraints on the thickness of the metallic leads at/near the junctions in order to fit within the shield gap G. result in large parasitic junction resistance $R_{par}$ which scales roughly as 1/SH. At the 100 nm device size, $R_{par}$ is already comparable to the intrinsic sensor resistance $R_{int}=R_{sq}\times(TW/SH)$, which for fixed sensor sheet resistance $R_{sq}$ and a fixed, optimized aspect ratio $SH/TW\approx 1$, is scale invariant. Because the bias voltage limitations due to Joule heating, the sensor output will be limited by the ratio of $R_{int}/(R_{int}+R_{par})$ which scales unfavorably as sensor size is reduced. Due to this, along with fabrication difficulty associated in lithographic limitations in forming the electrical junctions and maintaining robust electrical insulation from the shields, it is projected that CIP-SV sensor technology will not be extendable to sensor sizes at/near or below roughly 50 nm.

It is in this future, but approaching 50 nm sensor size regime, where Current-Perpendicular-to-Plane (CPP) technology is expected to replace the CIP devices used in virtually all disk-drive products to date. For CPP, the shields can serve as the leads, obviating the need for electrical isolation, and essentially eliminating parasitic resistance problems. The two prime candidates for CPP sensors used tunneling magnetoresistance (TMR), or CPP-GMR, the latter being most similar to in physical mechanism to CIP-GMR devices. Of these two, TMR sensors have to date received the most immediate attention and development for the first generation of CPP read heads, due to their potentially very large $\Delta R/R_0>>10\%$ However, the large resistance area product (RA) of TMR tunnel barriers ($\sim 2$ $\Omega$-$\mu m^2$) would predict prohibitively large device impedances RA/(TW×SH) in the ~50 nm device size regime. For this reason, CPP GMR-SV sensors (CPP-SV) with (RA$\approx$0.05-0.2 $\Omega$-$\mu m^2$) are receiving attention for longer term R&D as future read head technology.

Although similar, the transport properties of the CPP-SV differ somewhat from that of the CIP-SV. In particular, the magnetoresistance $R(Q)-R_0$ varies nonlinearly in the quantity $Q=\cos(\theta)$ described previously. FIGS. 2A-B qualitatively illustrates the change of resistance R as a function of $\cos(\theta)$ for a CPP-SV device, the actual layer structure being similar to a CIP-SV. It is believed that this aspect of CPP-SV and its consequences on bias point optimization has heretofore not been fully appreciated to the magnetic head community.

The inventors have found that this nonlinearity is such as to shift the optimum bias point to have non-orthogonal orientation between free and reference layer magnetization, such that $Q_b=\cos(\theta_{fb}-\theta_r)$ is negative rather than zero, perhaps as large as $Q_b\approx -0.5$. The present invention addresses several different ways to achieve this non-orthogonal bias point.

SUMMARY OF THE INVENTION

As mentioned above, for CIP sensors, the (in-plane) angular magnetization orientations $\theta_r$ and $\theta_{fb}$ of the reference and free layer structures at the bias point are ideally orthogonal each other, such that $|\theta_{fb}-\theta_r|\cong 90°$. However, as indicated in the graph of FIG. 2B, CPP sensors show magnetoresistance that is nonlinear in the quantity $Q=\cos(\theta_f-\theta_r)$. This nonlinearity is such as to shift the optimum sensitivity point to have free and reference bias magnetizations be more antiparallel, i.e., $|\theta_{fb}-\theta_r|>90°$ such that $Q_b=\cos(\theta_{fb}-\theta_r)$ is negative rather than zero, perhaps as large as $Q_b\approx -0.5$. The present invention includes and addresses several different ways to achieve this non-orthogonal bias point.

A CPP-SV head according to one embodiment includes a free layer having a nominal bias point magnetization orientation $\theta_{fb}$ in a first direction with respect to (and substantially parallel with) a longitudinal axis defined as the intersection of the plane of deposition of the free layer, and the plane of the air-bearing surface (ABS), a reference layer having a magnetization orientation $\theta_r$ nominally oriented in a second direction that is not orthogonal to $\theta_{fb}$, and a nonmagnetic spacer layer between the free and reference layers.

A CPP magnetic head according to another embodiment includes a pinned layer, a nonmagnetic antiparallel (AP)-coupling layer above the pinned layer, and a reference layer above the AP-coupling layer, the reference layer magnetization being substantially antiparallel to that of the pinned layer. A nonmagnetic spacer layer is positioned above the reference layer, and a free layer is positioned above the spacer layer. The free layer magnetization $\theta_{fb}$ is nominally oriented in a first direction with respect to (and substantially parallel with) a longitudinal axis defined as the intersection of the plane of deposition of the free layer, and the ABS plane. The reference layer has a magnetization orientation $\theta_r$ normally oriented in a second direction that is not orthogonal to $\theta_{fb}$.

A dual CPP magnetic head includes a free layer having a magnetization orientation $\theta_{fb}$ nominally oriented in a first direction, a first reference layer having a magnetization orientation $\theta_{r1}$ normally oriented in a second direction that is not orthogonal to $\theta_{fb}$, a first spacer layer between the free and first reference layers, and a second reference layer positioned on an opposite side of the free layer than the first reference layer, the second reference layer having a magnetization orientation $\theta_{r2}$ normally oriented in a third direction that is not orthogonal to $\theta_{fb}$, but is substantially parallel to $\theta_{r1}$. A second spacer layer is positioned between the free and second reference layers.

A magnetic storage system implementing any of the devices described above includes magnetic media, at least one head for reading from and writing to the magnetic media, each head having a sensor and a write element coupled to the sensor. A slider supports the head. A control unit is coupled to the head for controlling operation of the head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein. Further, particular features described herein can be used in combination with other described features in each of the various possible combinations and permutations.

Figure 3:
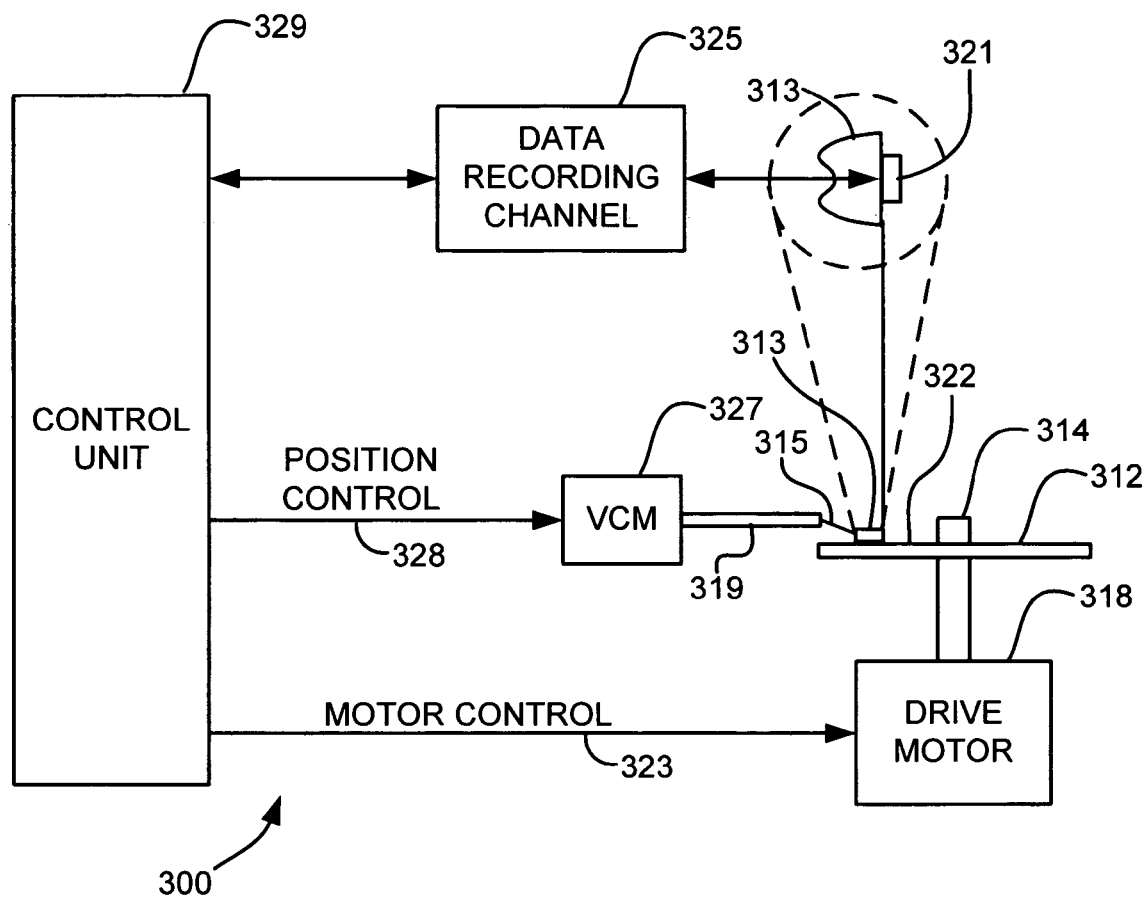
FIG. 3 is a simplified drawing of a prior art magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording on each disk is in the form of an annular pattern of concentric data tracks (not shown) on the disk 312.

At least one slider 313 is positioned near the disk 312, each slider 313 supporting one or more magnetic read/write heads 321. As the disks rotate, slider 313 is moved radially in and out over disk surface 322 so that heads 321 may access different tracks of the disk where desired data are recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
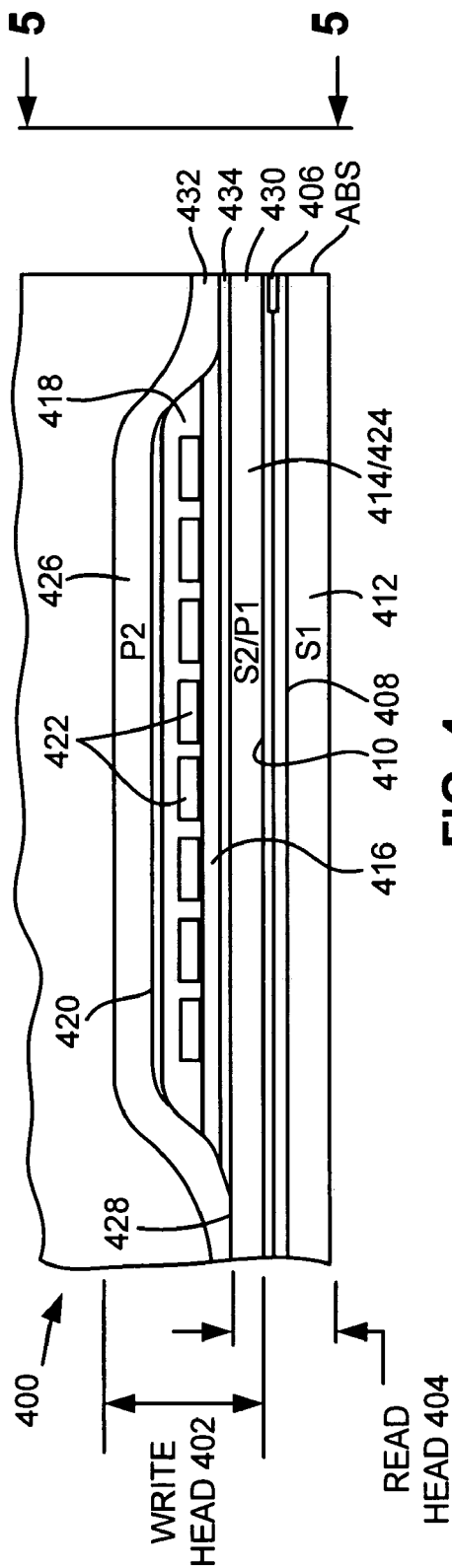
FIG. 4 is a partial view of a prior art slider and a prior art merged magnetic head.
Figure 5:
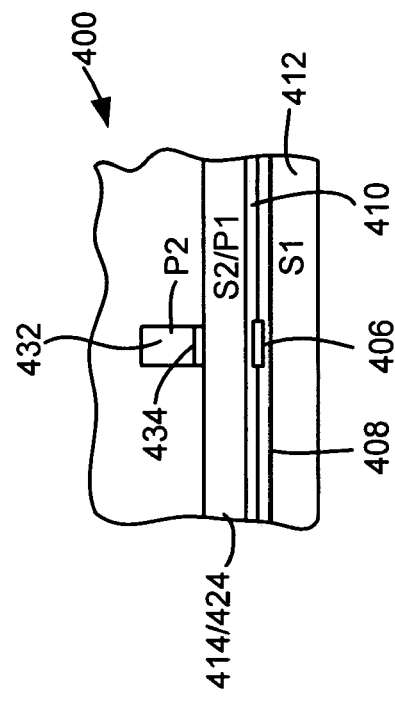
FIG. 5 is a partial ABS view, not to scale, of the prior art slider taken along plane 5-5 of FIG. 4 to show the read and write elements of the merged magnetic head.

FIG. 4 is a side cross-sectional elevation view of a merged magnetic head 400, which includes a write head portion 402 and a read head portion 404. FIG. 5 is an ABS view of FIG. 4. The spin valve sensor 406 is sandwiched between nonmagnetic electrically insulative first and second read gap layers 408 and 410, and the read gap layers are sandwiched between ferromagnetic first and second shield layers 412 and 414. In response to external magnetic fields, the resistance of the spin valve sensor 406 changes. A sense current ($I_s$) conducted through the sensor causes these resistance changes to be manifested as potential changes. These potential changes are then processed as readback signals by the processing circuitry 329 shown in FIG. 3.

The write head portion 402 of the magnetic head 400 includes a coil layer 422 sandwiched between first and second insulation layers 416 and 418. A third insulation layer 420 may be employed for planarizing the head to eliminate ripples in the second insulation layer caused by the coil layer 422. The first, second and third insulation layers are referred to in the art as an "insulation stack". The coil layer 422 and the first, second and third insulation layers 416, 418 and 420 are sandwiched between first and second pole piece layers 424 and 426. The first and second pole piece layers 424 and 426 are magnetically coupled at a back gap 428 and have first and second pole tips 430 and 432 which are separated by a write gap layer 434 at the ABS. Since the second shield layer 414 and the first pole piece layer 424 are a common layer this head is known as a merged head. In a piggyback head an insulation layer is located between a second shield layer and a first pole piece layer. First and second solder connections (not shown) connect leads (not shown) from the spin valve sensor 406 to leads (not shown) on the slider 313 (FIG. 3), and third and fourth solder connections (not shown) connect leads (not shown) from the coil 422 to leads (not shown) on the suspension.

Figure 1A:
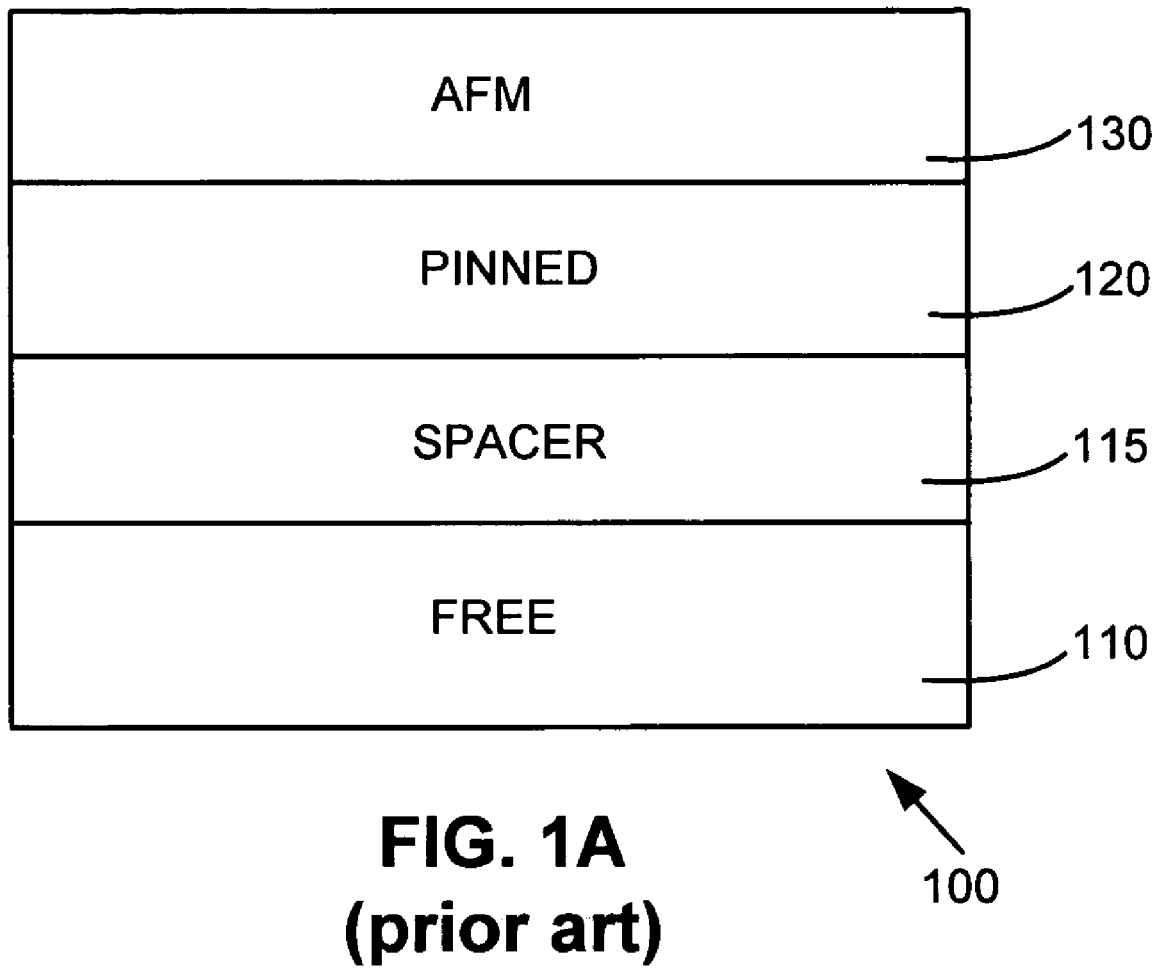
FIG. 1A is an air bearing surface view, not to scale, of a prior art spin valve (SV) sensor.
Figure 1B:
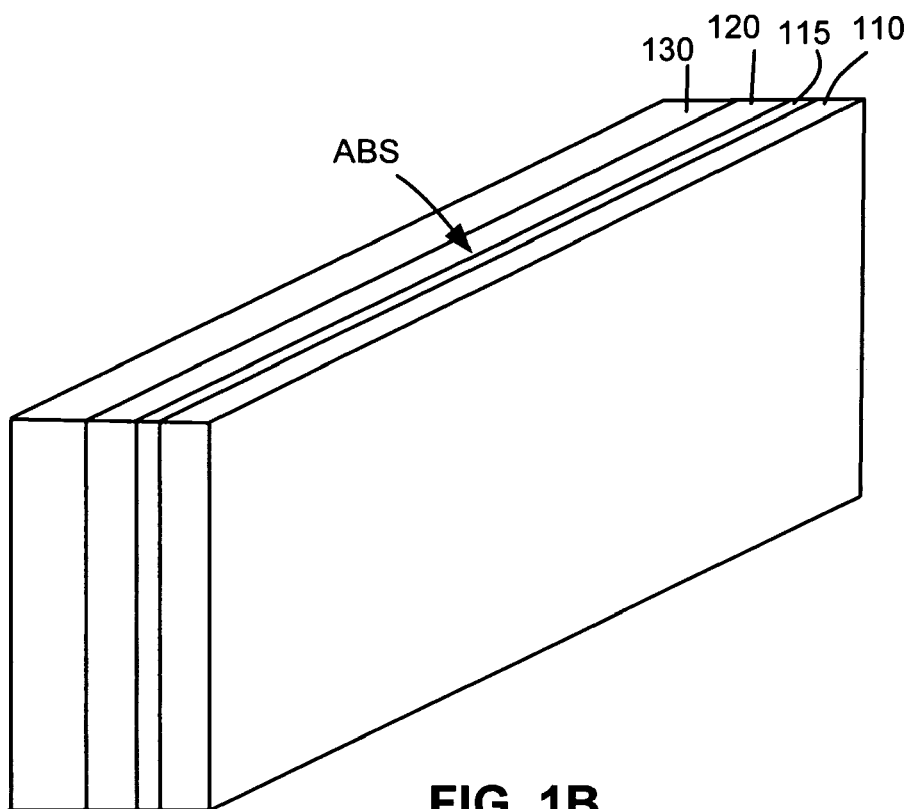
FIG. 1B is a perspective view, not to scale, of a prior art AP-Pinned SV sensor.
Figure 1C:
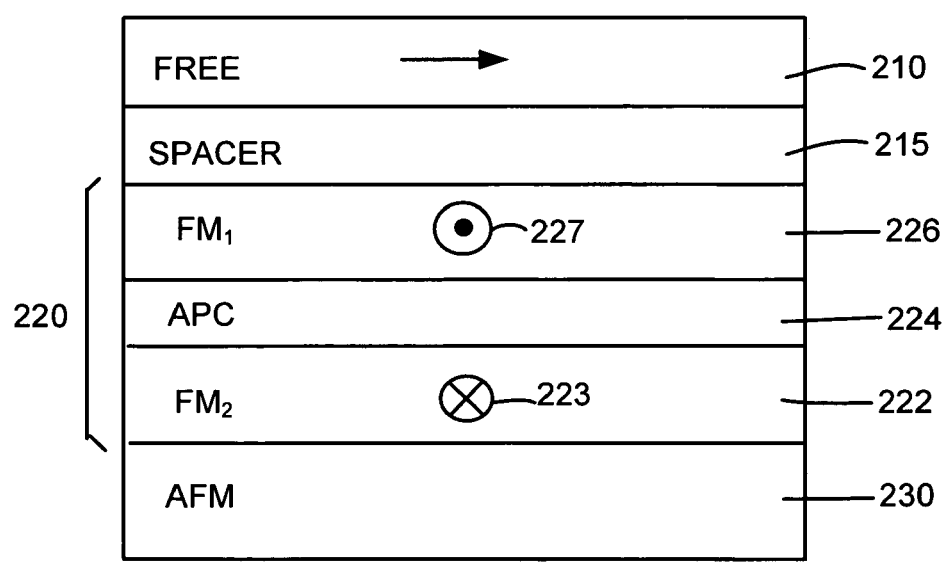
FIG. 1C is an air bearing surface view, not to scale, of a prior art AP-Pinned SV sensor.
Figure 2A:
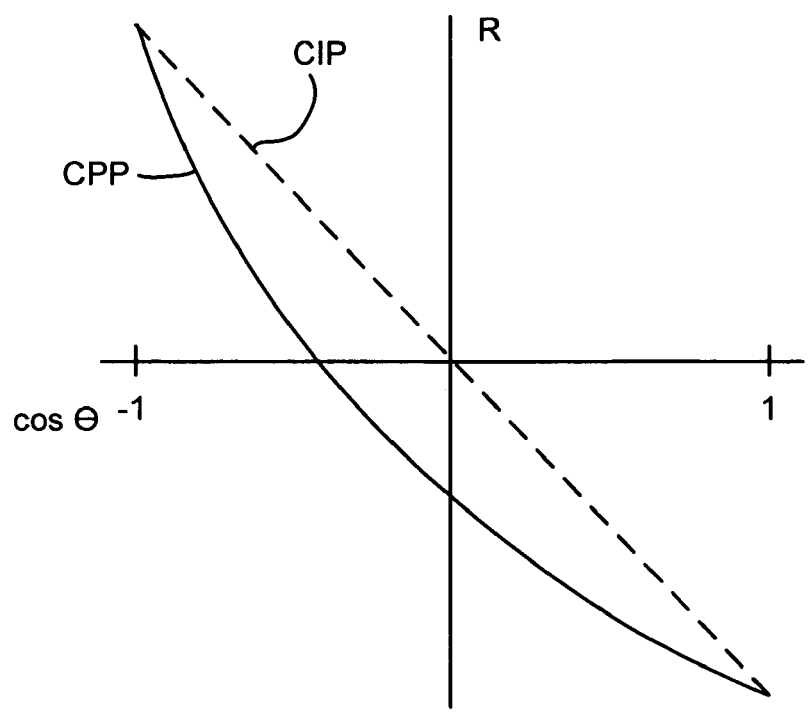
FIG. 2A illustrates the resistance as a function of cos for a CIP and CPP structure.
Figure 2B:
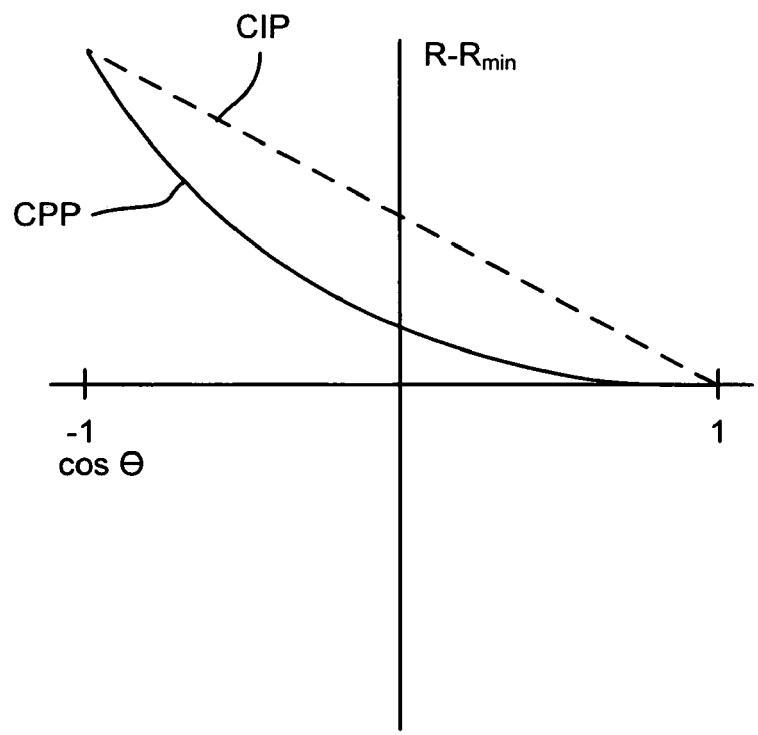
FIG. 2B illustrates the change of resistance (R-Rmin) as a function of cos $(\theta_f - \theta_r)$ for a CIP and CPP structure.

As mentioned above, for CIP sensors, the (in-plane) angular magnetization orientations $\theta_{ref}$ of the reference and $\theta_{free}$ of the free layers/structures are ideally orthogonal each other. However, as indicated in the graph of FIG. 2B, CPP-SV sensors show magnetoresistance that is nonlinear in the quantity $Q \equiv \cos(\theta_f - \theta_r)$: In particular, the resistance R(Q) has the generic form:

$$R(Q) = R(Q=1) + \Delta R \frac{1-Q}{(\Gamma+1)+(\Gamma-1)Q} \quad (1)$$

for values of parameter $\Gamma > 1$ ($\Gamma \approx 2$-3 perhaps being typical).

This nonlinearity is such as to shift the optimum sensitivity point to have free and reference bias magnetizations be more antiparallel, i.e., $|\theta_{fb} - \theta_r| > 90°$ such that $Q_b = \cos(\theta_{fb} - \theta_r)$ is negative rather than zero, perhaps as large as $Q_b \approx -0.5$. The present invention includes and addresses several different ways to achieve this non-orthogonal bias point.

Many types of heads can use the structures described herein, and the structures are particularly adapted to CPP-GMR sensors, including single and dual CPP-SV sensors. In the following description, the track edges of the layers are defined by the track width (W). The sensor height is in a direction into the face of the paper in an ABS view. The longitudinal axis of each layer is parallel to both the ABS and the plane of deposition. Unless otherwise described, thicknesses of the individual layers are taken perpendicular to the plane of the associated layer and are provided by way of example only and may be larger and/or smaller than those listed. Similarly, the materials listed herein are provided by way of example only, and one skilled in the art will understand that other materials may be used without straying from the spirit and scope of the present invention. Also, the processes used to form the structures are conventional. Further, each layer can include a single layer, laminates of layers, etc.

CPP GMR

Figure 6:
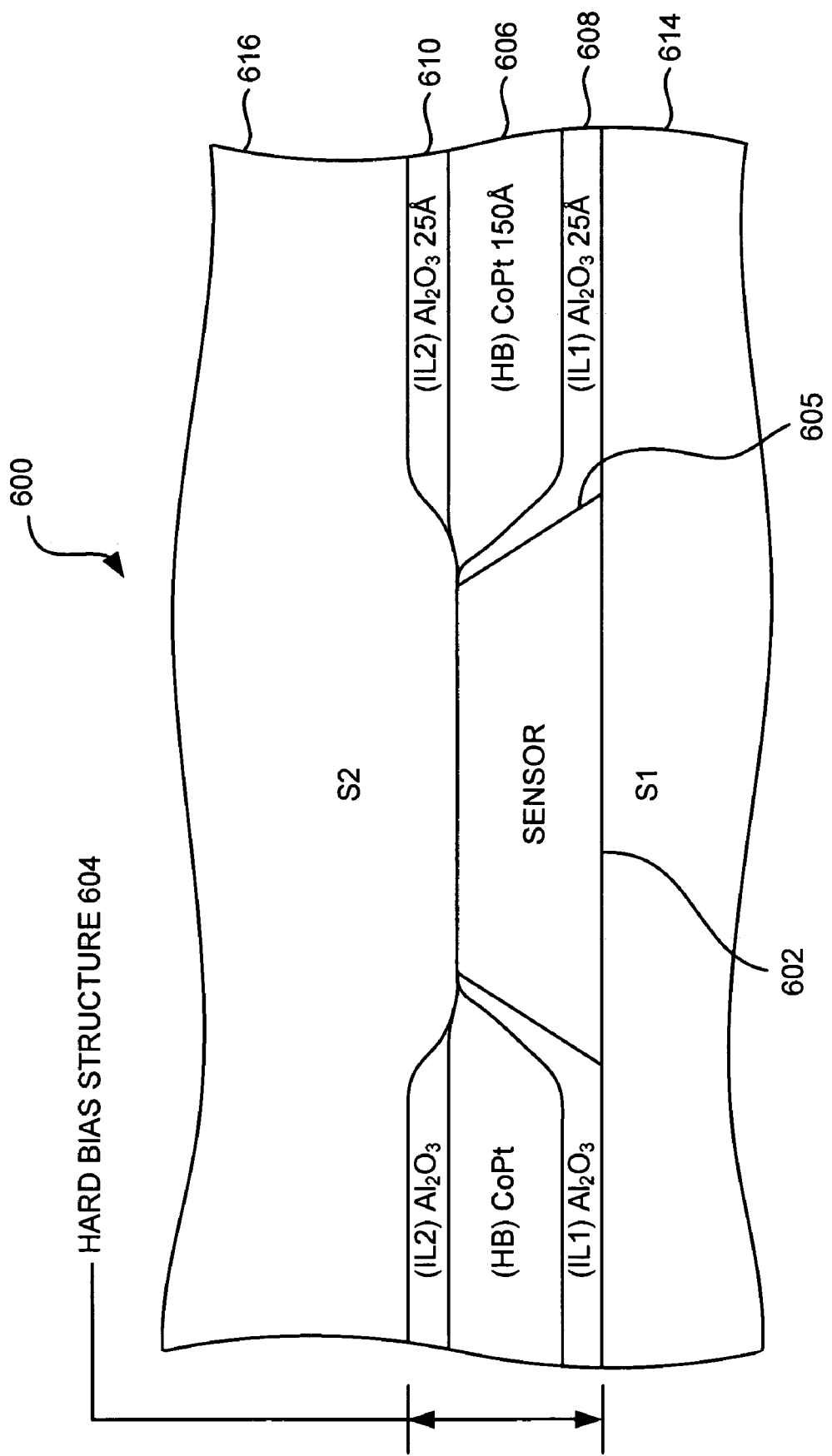
FIG. 6 is an ABS illustration of a sensor structure, not to scale, according to one embodiment of the present invention.

FIG. 6 depicts an ABS view of a sensor structure 600 according to one embodiment. As shown, a sensor 602 is positioned between two longitudinal bias structures 604, the bias structures being positioned outside track edges 605 of the sensor. The sensor 602 can be a standard sensor 602 of any type but having a pinned layer structure. Illustrative sensors 602 are shown in FIG. 7 et seq.

With continued reference to FIG. 6, each bias structure 604 includes a layer of hard bias material 606 which provides a longitudinal bias field to the free layer of the sensor 602 for stabilizing the free layer magnetization. Illustrative thicknesses of the hard bias layers 606 are 50-200 Å and exemplary materials from which the hard bias layers 606 may be formed include CoPt, CoPtCr, etc. Each hard bias layer 606 is sandwiched between a pair of electrically insulative layers (IL1), (IL2) 608, 610. Preferred materials from which the insulative layers 608, 610 can be formed include $Al_2O_3$ or other dielectric material.

In CPP sensors, the shields 614, 616 also serve as current leads.

Figure 7:
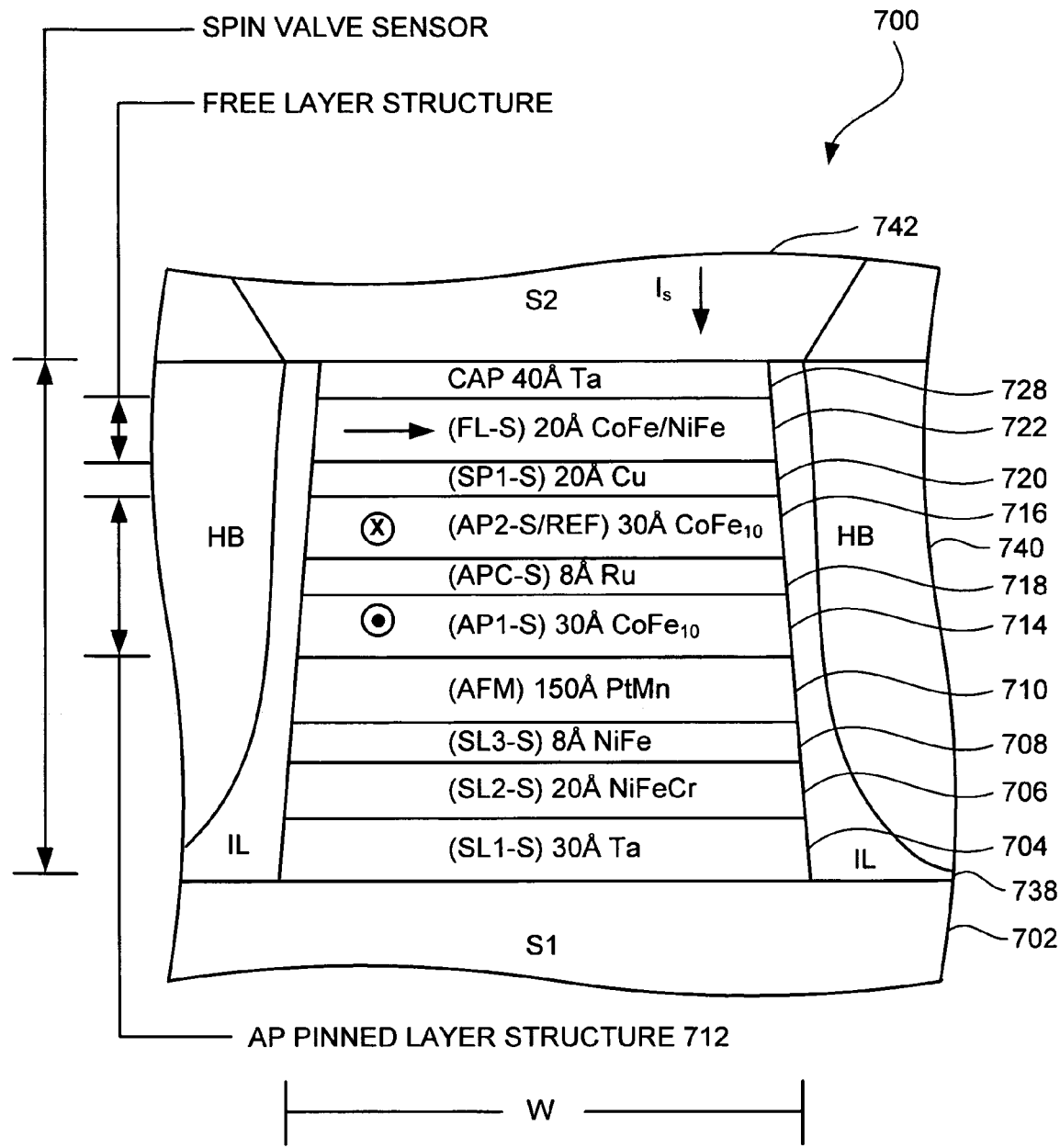
FIG. 7 is an ABS illustration of a CPP GMR sensor, not to scale, according to an embodiment of the present invention.

FIG. 7 depicts an ABS view of a CPP GMR sensor 700 according to one embodiment. "CPP" means that the sensing current ($I_s$) flows from one shield to the other shield in a direction perpendicular to the plane of the layers forming the sensor 700.

As shown in FIG. 7, a first shield layer (S1) 702 is formed on a substrate (not shown). The first shield layer 702 can be of any suitable material, such as permalloy (NiFe). An illustrative thickness of the first shield layer is in the range of about 0.5 to about 2 μm.

Seed layers 704 are formed on the first shield layer 702. The seed layers aid in creating the proper growth structure of the layers above them. Illustrative materials formed in a stack from the first shield layer 702 are a layer of Ta 704, a layer of NiFeCr 706, and a layer NiFe 708. Illustrative thicknesses of these materials are Ta (30 Å), NiFeCr (20 Å), and NiFe (8 Å). Note that the stack of seed layers can be varied, and layers may be added or omitted based on the desired processing parameters.

An antiferromagnetic layer (AFM) 710, or antiferromagnet, is formed above the seed layers. The antiferromagnetic layer 710 pins the magnetization orientation of any overlying adjacent ferromagnetic layer.

Then an antiparallel (AP) pinned layer structure 712 is formed above the seed layers. As shown in FIG. 7, first and second AP pinned magnetic layers, (AP1-S) and (AP2-S/REF) 714, 716, are separated by a thin layer of an antiparallel coupling (APC-S) material 718 (typically Ru) such that the magnetic moments of the AP pinned layers 714, 716 are strongly self-coupled antiparallel to each other. AP-pinned layer 714 is exchange pinned by the AFM layer 710. AP-pinned layer 716 serves as the reference layer. In the embodiment shown in FIG. 7, the preferred magnetic orientation of the pinned layers 714, 716 is for the first pinned layer 714, into the face of the structure depicted (perpendicular to the ABS of the sensor 702), and out of the face for the second pinned layer 716. Note that this orientation is canted in some embodiments. Illustrative materials for the pinned layers 714, 716 are $CoFe_{10}$ (100% Co, 10% Fe), $CoFe_{50}$ (50% Co, 50% Fe), etc. separated by a Ru layer 718. Illustrative thicknesses of the first and second pinned layers 714, 716 are between about 10 Å and 50 Å. The Ru layer 718 can be about 5-15 Å, but is preferably selected to provide a saturation field of order 10 kOe (or greater). In a preferred embodiment, each of the AP-pinned layers 714, 716 is about 30 Å with an Ru layer 718 therebetween of about 8 Å.

A first spacer layer (SP1-S) 720 is formed above the pinned layer structure 712. Illustrative materials for the first spacer layer 720 include Cu, $CuO_x$, $Cu/CoFeO_x/Cu$ stack, etc. The first spacer layer 720 can be about 10-60 Å thick, preferably about 30 Å.

A free layer (FL-S) 722 is formed above the first spacer layer 720. Though nominally stabilized in a substantially longitudinal orientation by the hard-bias structure 604, the magnetization of the free layer 722 remains susceptible to modest reorientation from external transverse magnetic fields, such as those exerted by data recorded on disk media. The relative motion of magnetic orientation of the free layer 722 when affected by data bits on disk media creates variations in the electrical resistance of the sensor 702, thereby creating the signal. Exemplary materials for the free layer 722 are CoFe/NiFe stack, etc. An illustrative thickness of the free layer 722 is about 10-40 Å. Note that some embodiments may deliberately cant the nominal bias-point orientation of the free layer magnetization to moderately deviate from the longitudinal direction.

The free and reference layers can each be formed of a single layer, a laminate of layers, etc.

A cap (CAP) 728 can be formed above the free layer 722. Exemplary materials for the cap 728 are Ta, Ta/Ru stack, etc. An illustrative thickness range of the cap 728 is 20-60 Å.

Insulating layers (IL) 738 are formed adjacent the stack to isolate it from the hard bias layers 740. A second shield layer (S2) 742 is formed above the cap 728.

Figure 8:
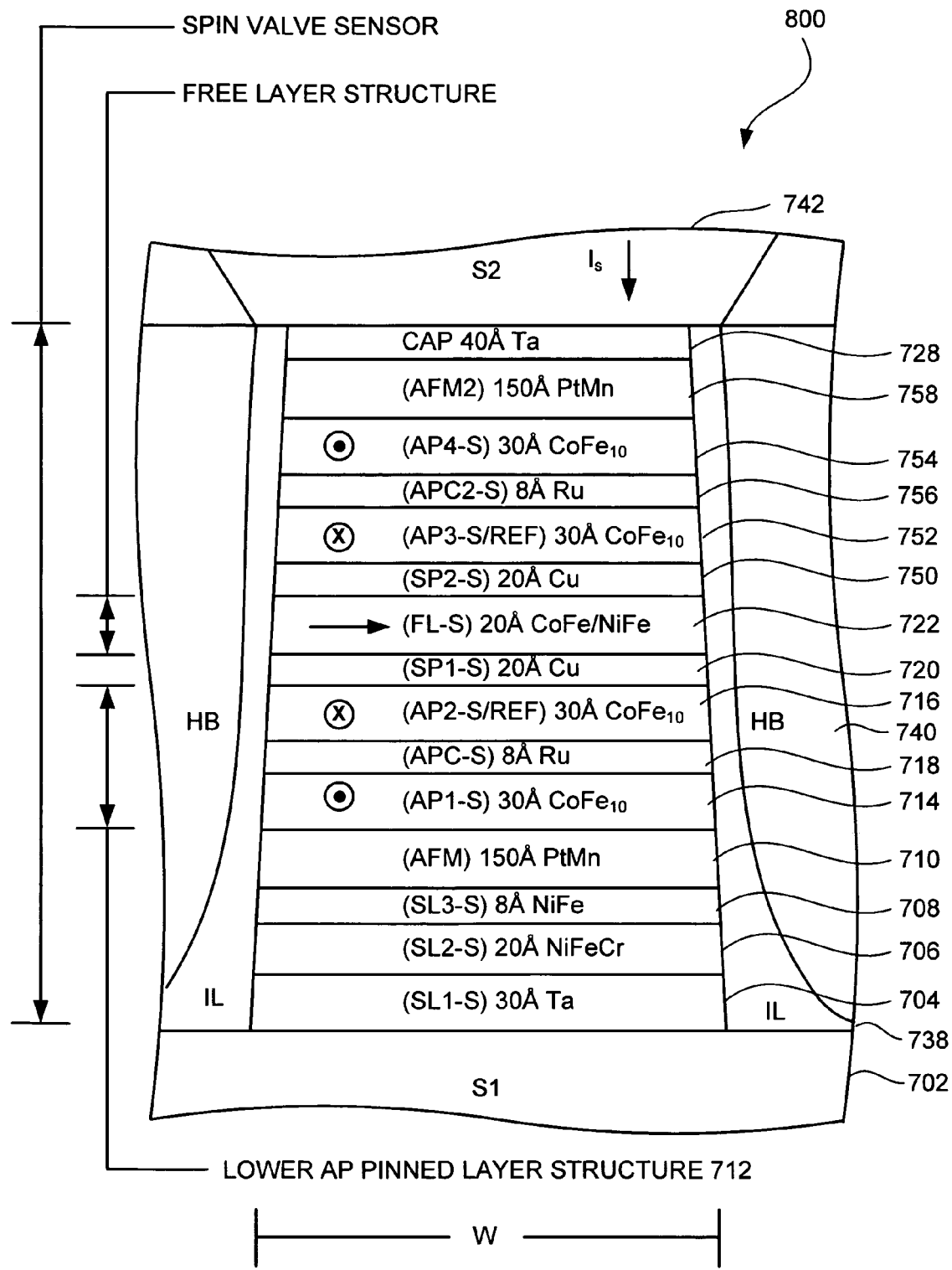
FIG. 8 is an ABS illustration of a dual CPP sensor, not to scale, according to an embodiment of the present invention.

FIG. 8 illustrates a dual CPP sensor 800, which is similar in construction to the sensor 700 of FIG. 7. The sensor 800 of FIG. 8 includes a second spacer layer (SP2-S) 750, a second pinned layer structure including AP pinned layers (AP3-S, AP4-S) 752, 754 surrounding a second AP coupling layer (APC2-S) 756 and a second AFM layer (AFM2) 758.

Methods of Setting $\theta_{fb}$ and/or $\theta_r$

Figure 9:
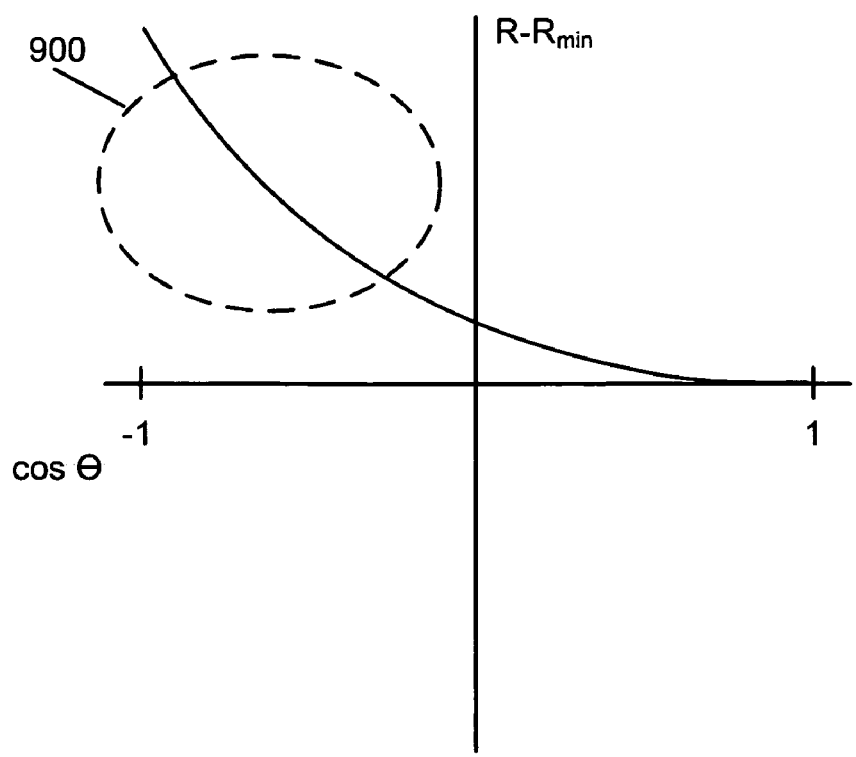
FIG. 9 illustrates the change of resistance as a function of cos(m_free−m_ref) for a CPP structure.

FIG. 9 illustrates the change of resistance R as a function of $Q \equiv \cos(\theta_f - \theta_r)$ for a CPP-GMR structure. Again, this nonlinearity is such as to shift the optimum sensitivity point to where free and reference bias magnetizations are more antiparallel, i.e., $|\theta_{fb} - \theta_r| > 90°$ such that $Q_b = \cos(\theta_{fb} - \theta_r)$ is negative rather than zero, perhaps as large as $Q_b \approx -0.5$. Circle 900 illustrates a preferred range of operation achievable by orienting $\theta_{fb}$ and $\theta_r$ non-orthogonally. The present invention addresses several different ways to achieve this non-orthogonal bias point.

Present day CIP-GMR read heads use the magnetostatic field from contiguous, longitudinally magnetized, hard-magnet films (hard-bias) 740 (FIG. 7) to longitudinally stabilize the free layer 722 with $\theta_{fb} \cong 0°$, and exchange pinning to a pinned layer 714 of an AP-coupled pin/reference layer pair to align the reference layer 716 transverse to the ABS with $\theta_r \cong \pm 90°$, and hence approximately orthogonal to the free layer orientation. The pinning direction is set by annealing the entire magnetic film structure (at wafer level, row level, or both) at elevated temperatures and in very large magnetic fields so to maintain (saturate) the pinned layer magnetization in the desired pinning direction during the anneal. In this case, the finished sensor has the pinned/reference layers 714, 716 exchange pinned nominally in the transverse direction ($\theta_r \cong \pm 90°$), and the free layer 722 magnetized longitudinally ($\theta_{fb} \cong 0°$), parallel to the direction of the field from the hard-bias 704, approximately orthogonal to the reference layer magnetization. To a modest degree, the free layer orientation is also influenced by the remnant demagnetizing fields from the combined pinned/reference AP-coupled films, as well as (but usually to a yet lesser degree) the interlayer coupling between free and reference layer which depends on the thickness (and roughness) of the e.g., Cu spacer layer between them.

Figure 10:
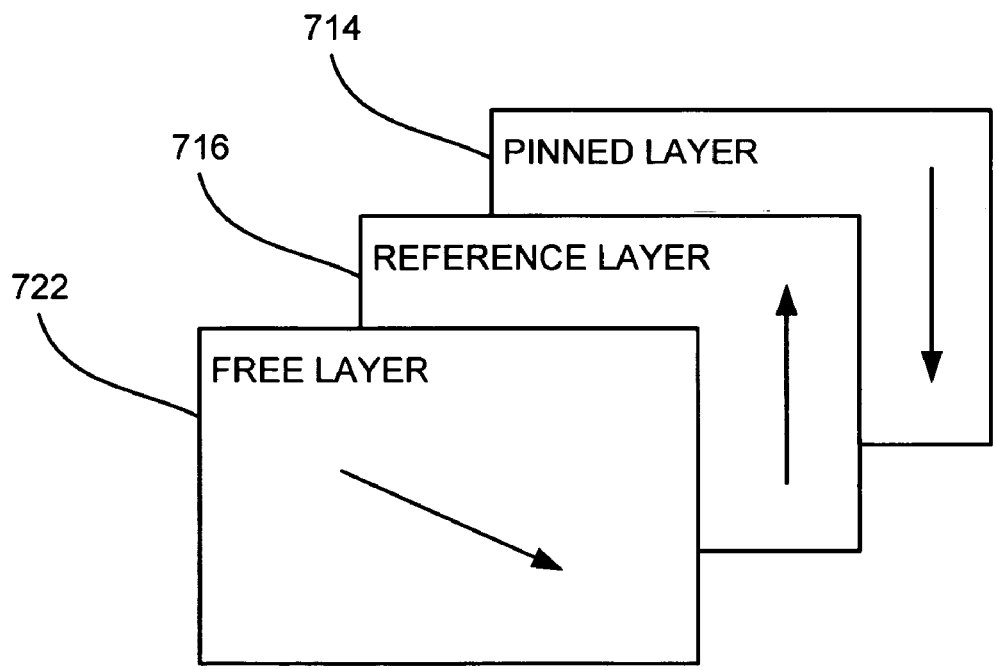
FIG. 10 is a graphical representation of magnetic orientations of free and reference layers according to one embodiment.

One embodiment of the present invention uses similar device processing, but rotates the quiescent free layer bias-point orientation $\theta_{fb} \neq 0°$ by controlling the magnitude and polarity/direction of the combined demagnetizing and interlayer coupling fields. FIG. 10 illustrates the bias-point magnetic orientations in such an embodiment. The demagnetizing fields can be controlled by the moment mismatch $\Delta m \equiv m_{ref} - m_{pin}$, preferentially using $\Delta m > 0$ such that the net demagnetizing field is naturally antiparallel to the magnetization direction of the reference layer. The interlayer coupling is controlled by the thickness of the e.g., Cu spacer. One drawback of this embodiment is that to achieve $Q_b = \cos(\theta_{fb} - \theta_r) \sim -0.5$, or $\theta_{fb} \approx 30°$, high combined demagnetizing and coupling fields of several hundred Oe may need to be present in 50 nm size read sensors in order to get significant rotation of $\theta_{fb} \approx 30°$ in the presence of substantial hard-bias longitudinal fields of 500-1000 Oe. This may require sufficiently large $\Delta m \equiv m_{ref} - m_{pin}$ as to destabilize the reference layer.

Figure 11:
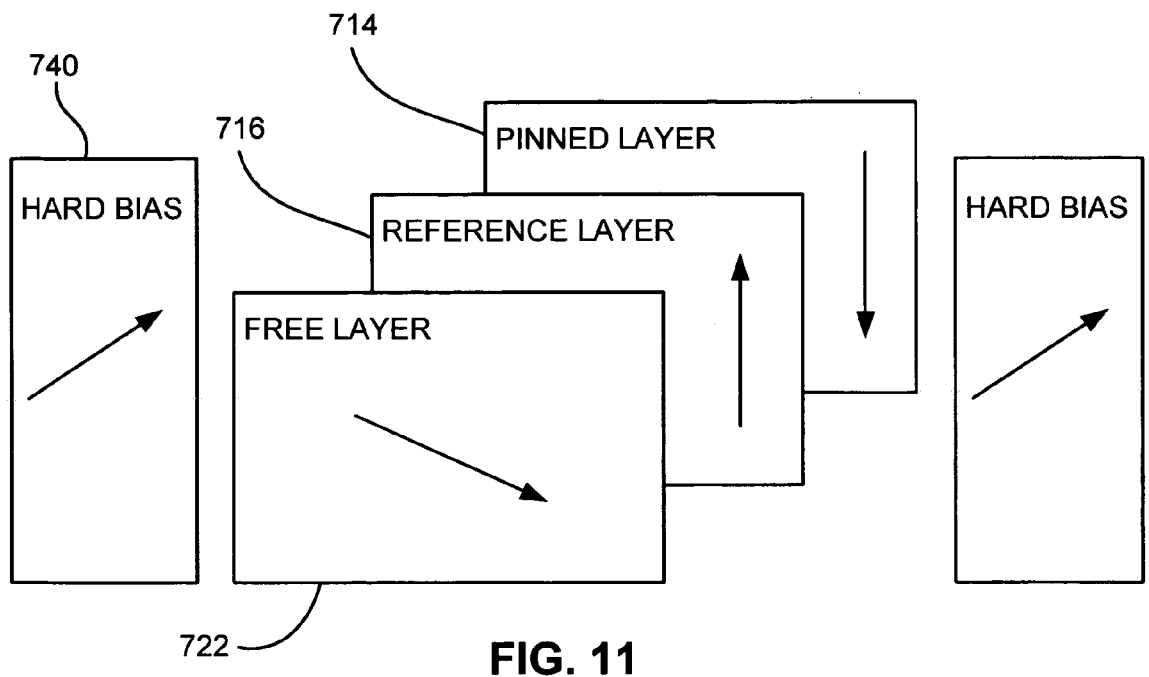
FIG. 11 is a graphical representation of magnetic orientations of free, reference, and hard bias layers according to one embodiment.

Another embodiment (which could be combined with the previous embodiment) would cause a rotation of the quiescent free layer magnetization orientation to $\theta_{fb} \neq 0°$ by producing a transverse component to the hard-bias field by a concomitant rotation of the hard-bias magnetization orientation. This embodiment is represented in FIG. 11. Canting the direction of the had-bias magnetization is relatively easy to do with magnetically isotropic hard bias films, simply by controlling the orientation of the magnetic field in an otherwise standard hard-bias initialization process. One drawback of this approach is that the conventional hard bias geometry has the hard-bias contiguous only along the longitudinal edges of the sensor, such that the magnetic shields of the read sensor will preferentially quench transverse fields from the hard bias. As a result, the hard-bias field orientation at the free layer is much more longitudinally oriented than that of the hard-bias magnetization itself, and obtaining a large transverse component of the hard bias field necessitates a substantial reduction of the net hard-bias field magnitude. Achieving a substantially rotated free layer bias-point orientation of $\theta_{fb} \approx 5°$ to $\theta_{fb} \approx 30°$ while still maintaining magnetic stability with sufficiently large magnitude (500-1000 Oe) of net hard-bias field may not be possible using the conventional hard-bias geometry. While this latter problem may be alleviated by leaving in place (rather than milling away) hard-bias film at the top (opposite the ABS) edge of the sensor, this alternative introduces added fabrication complexity to an already difficult process step.

Figure 12:
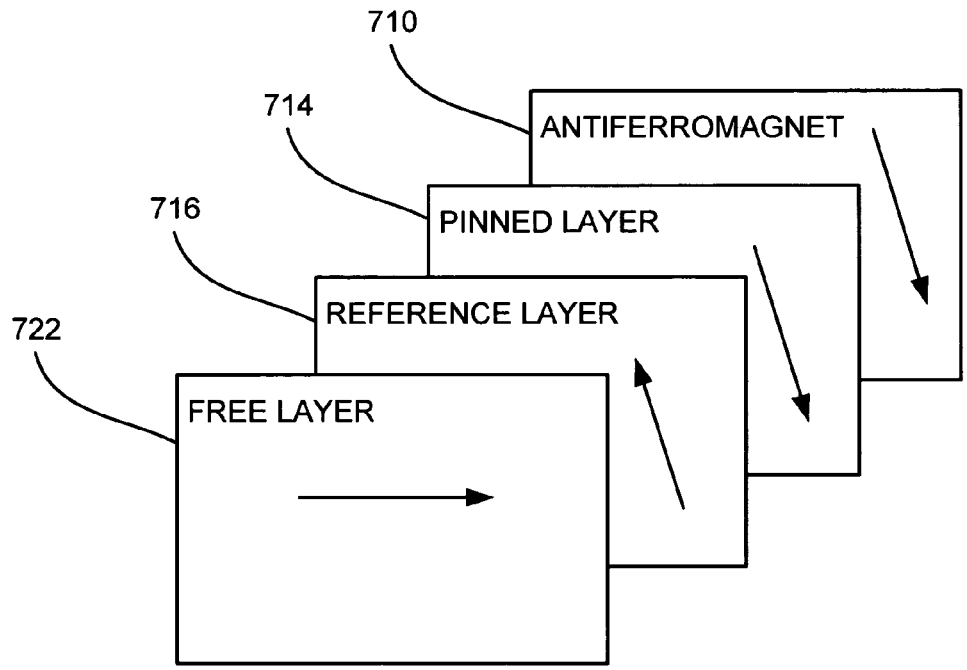
FIG. 12 is a graphical representation of magnetic orientations of free, reference, and antiferromagnetic layers according to one embodiment.

A preferred embodiment of the present invention, represented in FIG. 12, maintains the free layer in a stable longitudinal orientation, and instead rotates the orientation of the exchange pinning direction $|\theta_p| < 90°$ away from purely transverse such that the now non-zero longitudinal component of the pinning direction is parallel to that of the magnetization of the hard-bias/free-layer, i.e., $|\theta_{fb} - \theta_p| < 90°$. Due to very strong AP coupling between the pinned and reference layers, this will in turn yield a longitudinal component of reference layer magnetization that is antiparallel to that of the free layer, i.e., $|\theta_{fb} - \theta_r| > 90°$. For example, a ferromagnetic pinned layer film can be exchange pinned by an antiferromagnet to maintain the pinned layer bias-point magnetization in the film plane at an orientation angle $\theta_{pb} \neq \theta_{fb} \pm 90°$ which is not orthogonal to the free layer orientation $\theta_{fb}$, and wherein the reference layer orientation $\theta_{rb} \cong \theta_{pb} \pm 180°$ is antiparallel to that of the pinned layer. The result is a way of adjusting $\cos(\theta_{fb}-\theta_r)$ to have any value between the extremes of 0 and −1. Controlling the pinned direction can be achieved by mechanical fixturing to control the orientation angle that either wafer, row, or single head are mounted relative to that of the magnet used in the annealing process described above. The net field orientation angle seen by the pinned/reference layers during the anneal is also influenced by the presence of the magnetic shields of the sensor, but this is a systematic effect which can either be accounted for, or simply overwhelmed by the several Tesla fields from superconducting annealing magnets currently available for this purpose. This preferred embodiment has the added advantage of not compromising of free layer or pinned/reference stability, by allowing $|\sin\theta_b| \ll |Q_b|$ and preferentially small or zero Am. Nonetheless, this embodiment allows the flexibility to be combined with the first (as well as second) embodiments to induce a modest $\theta_{fb} \neq 0°$ in order to deliberately adjust the asymmetric curvature to the magnetic response $\theta_r-\theta_{fb}$ vs. $H_{sig}$ of the free layer. This allows cancellation of the monotonic curvature in the of the function $R(Q)-R(Q_b)$ natural to CPP-GMR (FIG. 2B), such that $R(Q)-R(Qb)$ will vary approximately linearly with $H_{sig}$.

Yet another, more subtle potential advantage of this embodiment may arise from a "micromagnetic anisotropy" effect that is predicted to occur in pinned/reference AP pinned layer structures, despite whether the sensor has the preferred, approximately square sensor geometry (TW≅SH), and even in the (magnetostatically most stable) moment-matched case of $\Delta m=0$. Magnetostatic in origin, this "micromagnetic anisotropy": shows biaxial character with easy-axes of relatively broad energy minima along the diagonals of the square sensor ($\theta_r=\pm135°$), and hard-axes with sharper energy maxima in the transverse ($\theta_r=\pm90°$) or longitudinal direction. The magnitude of this biaxial anisotropy increases rapidly as the ratio of thickness to exchange length approaches unity, and may reach several hundred Oe in practical cases of pin/reference layer thickness equivalent to ~3 nm of CoFe. This places an added burden on necessary exchange pinning strength of the AFM/pinned-layer couple to maintain stability of the conventional transverse $\theta_p=\pm90°$ pinning orientation. For CPP-GMR sensors in particular, the magnetoresistive coefficient ARIR favors increasing the layer thicknesses, thus exacerbating this problem relative to CIP-GMR. By employing the third embodiment of the present invention and systematically operating with canted pinned/reference layers orientated significantly closer to the diagonal than purely transverse pinning, the net stability of pinned/reference layer stiffness (particularly if SH≦TW) will be enhanced, and pinned/reference layer magnetic fluctuation noise will be reduced.

Figure 13:
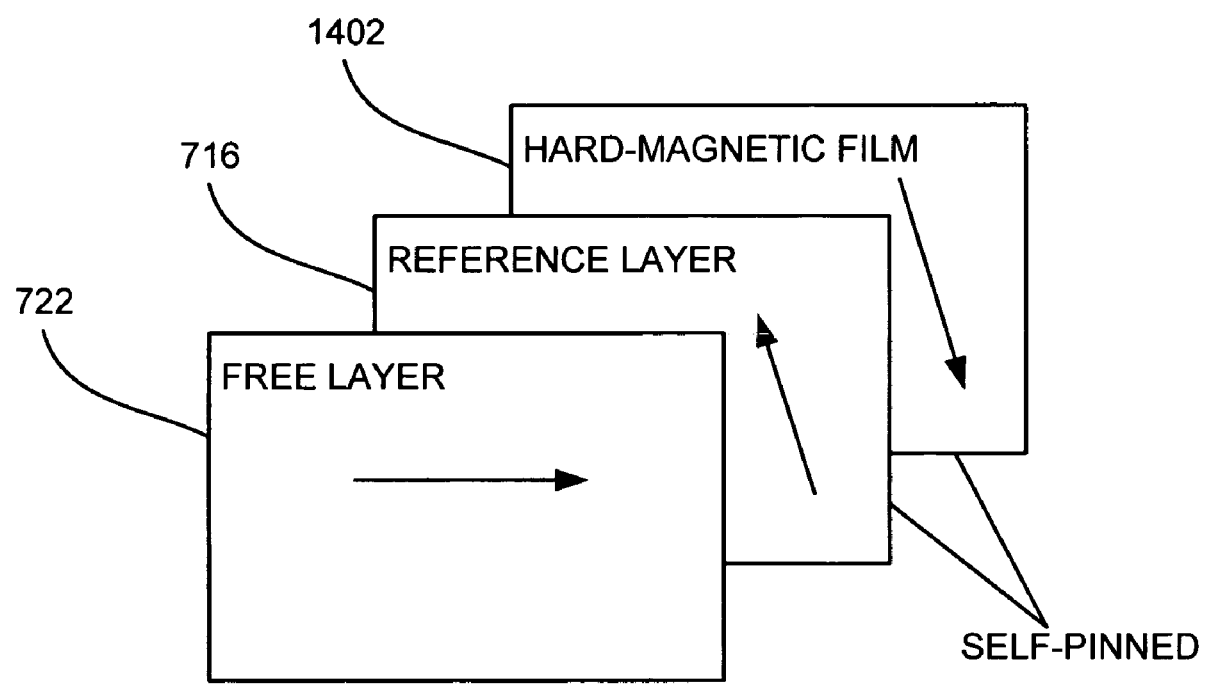
FIG. 13 is a graphical representation of magnetic orientations of free, reference, and pinned layers according to one embodiment.
Figure 14:
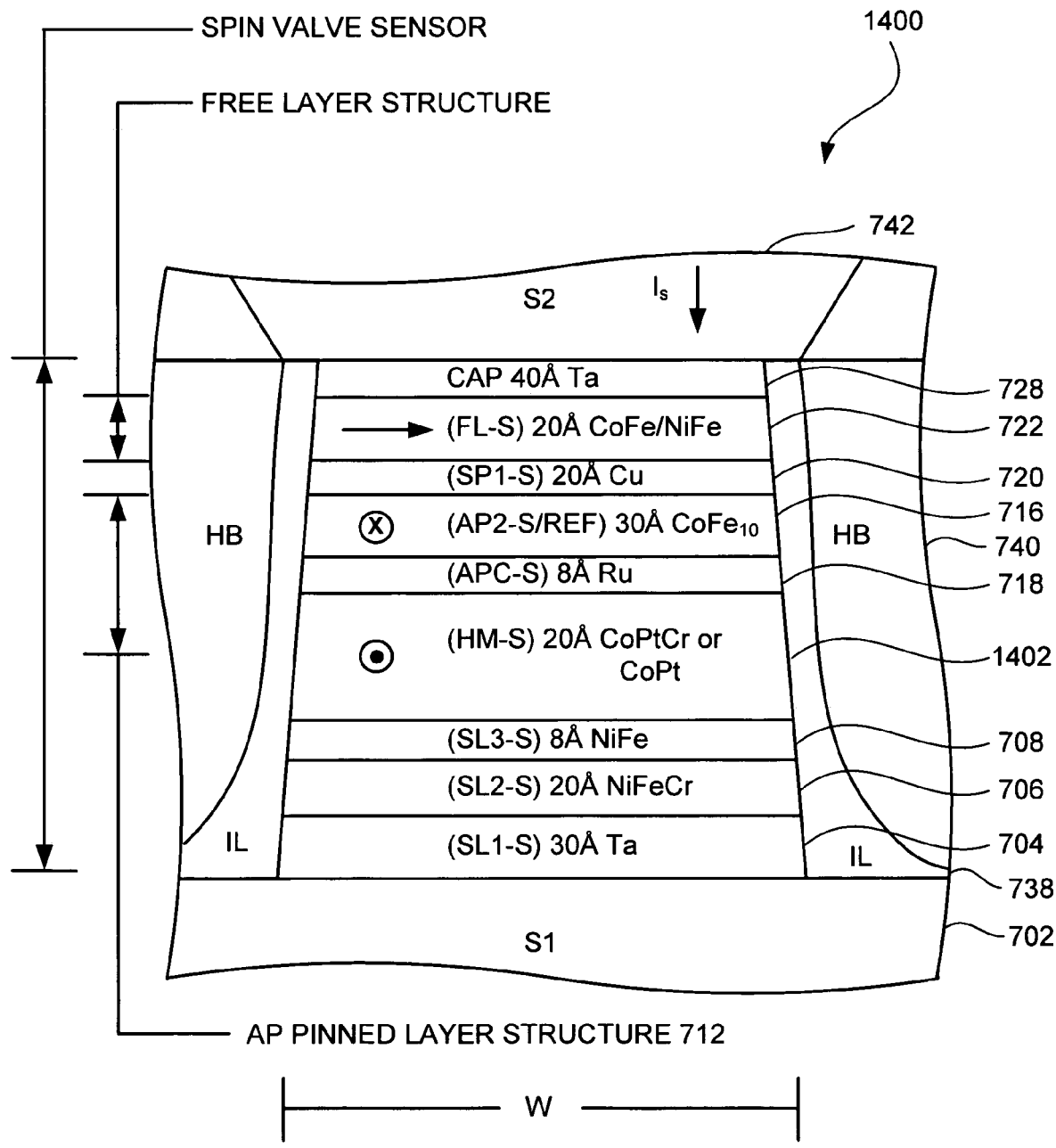
FIG. 14 is an ABS illustration of a CPP GMR self pinned sensor, not to scale, according to an embodiment of the present invention.

In a variation on the above, represented in FIG. 13, that part of the AP-pinned layer structure comprising the AFM layer 710 and Ap1-S (pinned layer) 714 is replaced by the single layer of a hard-magnetic film (HM) 1402 (e.g., CoPt, or CoPtCr) in FIG. 14, which similarly functions both magnetically and electrically in the role of the Ap1-S "pinned" layer. The advantage of this variation is that both the total physical thickness, as well as thickness-resistivity product of a hard layer 1402 such as CoPt can be a few to many times smaller than that of the a typical AFM/AP1-S combination due to the relatively large resistivity and thickness of most applicable AFM layers, e.g., PtMn or IrMn. The lower resistivity-thickness product can both substantially reduce the intrinsic parasitic resistance of the CPP-SV layer stack, and simultaneously substantially lower the net stack thickness that is constrained to fit within the read gap G between the read shields. The latter advantage can be magnified two-fold in the case of a dual CPP-SV, in which both bottom and top AFM/AP1-bilayers are each replaced with single hard-magnet "pinned" layer (HMPL). The orientation of the HMPL can be set in a magnetic field analogously to the procedure used for the hard-bias layers. However, since the magnetization orientations of these distinct hard films will need to be non-collinear in general, it would likely be necessary to introduce magnetic anisotropy into to one or both of these hard layers, or the purpose being to avoid re-orienting the hard layer that was set first during the orientation setting of the second hard layer. One method for introducing such anisotropy in a controlled orientation has been described in copending U.S. Patent Appl. entitled Magnetic Read Sensor Employing Oblique Etched Underlayers for Inducing Uniaxial Magnetic Anisotropy in a Hard Magnetic Pinning Layer, Ser. No. 11/097920, filed Mar. 31, 2005 by Carey et al., and which is herein incorporated by reference.

While various embodiments have been described above, it should be understood that they have been presented by way of example only, and not limitation. For example, the structures and methodologies presented herein are generic in their application to all CPP heads. Thus, the breadth and scope of a preferred embodiment should not be limited by any of the above-described exemplary embodiments, but should be defined only in accordance with the following claims and their equivalents.

What is claimed is:

1. A CPP spin-valve magnetic head having an air bearing surface (ABS), comprising:
   a ferromagnetic free layer film having a bias-point magnetization nominally oriented in plane of the film therof, in a first direction at an angle $\theta_{fb}$ with respect to a longitudinal axis being defined as the intersection of the plane of deposition of the free layer and the plane of the ABS;
   a ferromagnetic reference layer film having a bias-point magnetization nominally oriented in a plane of the film thereof, in a second direction at angle $\theta_{rb}$ with respect to said longitudinal axis that is not orthogonal to the said first direction; and
   a nonmagnetic spacer layer between the free and reference layers.

2. A head as recited in claim 1, wherein $\cos(\theta_{fb}-\theta_{rb})$ is less than zero.

3. A head as recited in claim 1, wherein $\cos(\theta_{fb}-\theta_{rb})$ is less than about −0.2.

4. A head as recited in claim 1, wherein $\cos(\theta_{fb}-\theta_{rb})$ is less than about −0.5.

5. A head as recited in claim 1, wherein the reference layer magnetization orientation angle $\theta_{rb}$ is approximately orthogonal to the said longitudinal axis, wherein the free layer orientation angle $\theta_{fb}$ is not nominally parallel to said longitudinal axis.

6. A head as recited in claim 5, wherein the orientation $\theta_{fb}$ of the free layer magnetization is determined by the polarity and direction of demagnetization and interlayer coupling fields from the reference layer.

7. A head as recited in claim 5, further comprising hard bias layers positioned on opposite sides of the free layer and having a magnetization direction oriented at an angle from the longitudinal axis of the free layer, wherein $\theta_{fb}$ is oriented in the first direction by magnetic fields emanating from the hard bias layers.

8. A head as recited in claim 7, wherein the magnetization direction of the hard bias layers is oriented at an angle of about 5 to about 30 degrees from the said longitudinal axis, wherein the free layer magnetization is oriented in the first direction $\theta_{fb}$ by magnetic fields emanating from the hard bias layers.

9. A head as recited in claim 1, wherein the free layer magnetization orientation $\theta_{fb}$ is substantially parallel to the said longitudinal axis, wherein the reference layer orientation angle $\theta_{rb}$ is non-orthogonal to the said longitudinal axis.

10. A head as recited in claim 9, further comprising a ferromagnetic pinned layer film exchange pinned by an antiferromagnet to maintain the pinned layer bias-point magnetization in the film plane at an orientation angle $\theta_{pb}$ which is not orthogonal to the free layer orientation $\theta_{fb}$, and wherein the reference layer orientation $\theta_{rb}$ is antiparallel to the orientation $\theta_{pb}$ of the pinned layer.

11. A magnetic storage system, comprising:
   magnetic media;
   at least one head for reading from and writing to the magnetic media, each head having:
      a sensor having the structure recited in claim 1;
      a write element coupled to the sensor;
   a slider for supporting the head; and
   a control unit coupled to the head for controlling operation of the head.

12. A CPP magnetic head having an air bearing surface (ABS), comprising:
   a ferromagnetic pinned layer;
   an antiparallel coupling layer above the pinned layer;
   a ferromagnetic reference layer above the antiparallel coupling layer, the reference layer being antiparallel coupled to the pinned layer;
   a spacer layer above the reference layer;
   a ferromagnetic free layer above the spacer layer, a longitudinal axis being defined as the intersection of the plane of deposition of the free layer and the plane of the ABS;
   wherein the free layer has a bias-point magnetization orientation nominally in the film plane in a first direction at an angle $\theta_{fb}$ with respect to said longitudinal axis; and
   wherein the reference layer has a bias-point magnetization orientation $\theta_{rb}$ nominally in the film plane in a second direction at an angle that is not orthogonal to the first direction.

13. A head as recited in claim 12, wherein $\cos(\theta_{fb}-\theta_{rb})$ is less than zero.

14. A head as recited in claim 12, wherein $\cos(\theta_{fb}-\theta_{rb})$ is less than about −0.2.

15. A head as recited in claim 12, wherein $\cos(\theta_{fb}-\theta_{rb})$ is less than about −0.5.

16. A head as recited in claim 12, wherein $\theta_{rb}$ is substantially orthogonal to said longitudinal axis, wherein $\theta_{fb}$ is not nominally parallel to the longitudinal axis of the free layer.

17. A head as recited in claim 16, wherein the orientation $\theta_{fb}$ of the free layer magnetization is determined by the polarity and direction of demagnetization and interlayer coupling fields from the reference and pinned layers.

18. A head as recited in claim 16, further comprising hard bias layers positioned on opposite sides of the free layer and having a magnetization direction oriented at an angle from the longitudinal axis of the free layer, wherein $\theta_{fb}$ is oriented in the first direction by magnetic fields emanating from the hard.

19. A head as recited in claim 18, wherein the magnetization direction of the hard bias layers is oriented at an angle of about 5 to about 30 degrees from the longitudinal axis of the free layer, wherein $\theta_{fb}$ is oriented in the first direction by magnetic fields emanating from the hard bias layers.

20. A head as recited in claim 12, wherein the free layer magnetization orientation $\theta_{fb}$ is substantially parallel to the said longitudinal axis, wherein the reference layer orientation angle $\theta_{rb}$ is non-orthogonal to the said longitudinal axis.

21. A head as recited in claim 20, further comprising an antiferromagnet layer which exchange pins the bias-point magnetization of the pinned layer in a nominal direction in the film plane at orientation angle $\theta_{pb}$ which is not orthogonal to the free layer orientation $\theta_{fb}$, and wherein the reference layer orientation $\theta_{rb}$ is antiparallel to the orientation angle $\theta_{pb}$ of the pinned layer.

22. A head as recited in claim 12, wherein the direction of the pinned layer magnetization is fixed in orientation by means other than that of exchange pinning to an antiferromagnet layer.

23. A magnetic storage system, comprising:
   magnetic media;
   at least one head for reading from and writing to the magnetic media, each head having:
      a sensor having the structure recited in claim 12;
      a write element coupled to the sensor;
   a slider for supporting the head; and
   a control unit coupled to the head for controlling operation of the head.

24. A dual CPP magnetic head having an air bearing surface (ABS), comprising:
   a ferromagnetic free layer film having bias-point magnetization orientation nominally in the film plane in a first direction described by angle $\theta_{fb}$ with respect to a longitudinal axis defined by the intersection of the free layer film plane and a plane of the ABS;
   a first ferromagnetic reference layer film having a magnetization orientation nominally in a plane of the film thereof in a second direction described by angle $\theta_{r1}$ that is not orthogonal to the first direction;
   a first spacer layer between the free and first reference layers;
   a second reference layer positioned on an opposite side of the free layer than the first reference layer, the second reference layer having a magnetization orientation nominally in a plane of the film thereof in a third direction normally oriented in a third direction described by angle $\theta_{r1}$ that is not orthogonal to the first direction; and
   a second spacer layer between the free and second reference layers.

25. A head as recited in claim 24, wherein the first and second reference layers are substantially similar in physical properties, and wherein $\theta_{r1} \cong \theta_{r2}$, and wherein the first and second spacer layers are substantially similar in physical properties.

26. A head as recited in claim 24, wherein $\cos(\theta_{fb}-\theta_{r1})$ is less than zero.

27. A head as recited in claim 24, wherein $\cos(\theta_{fb}-\theta_{r1})$ is less than about −0.2.

28. A head as recited in claim 24, wherein first and second reference layer magnetization directions $\theta_{r1}$, $\theta_{r2}$ are substantially orthogonal to the longitudinal axis of the free layer, wherein free layer magnetization direction $\theta_{fb}$ is not nominally parallel to the longitudinal axis of the free layer.

29. A head as recited in claim 24, wherein the free layer magnetization direction $\theta_{fb}$ is substantially parallel to the longitudinal axis, wherein first and second reference layer magnetization directions $\theta_{r1} \theta_{r2}$ are non-orthogonal to the longitudinal.

30. A magnetic storage system, comprising:
   magnetic media;
   at least one head for reading from and writing to the magnetic media, each head having:
      a sensor having the structure recited in claim 24;

a write element coupled to the sensor;
a slider for supporting the head; and
a control unit coupled to the head for controlling operation of the head.

31. A magnetic head, comprising:
a free layer;
a reference layer;
a pinned layer
a coupling layer between the pinned and reference layers; and
a spacer layer between the free and reference layers;
wherein the reference layer has a magnetization direction fixed by the pinned layer through a coupling layer,
wherein the antiferromagnetic layer fixes the direction of magnetization of the pinned layer,
wherein the direction of magnetization of the free layer is oriented relative to the direction of magnetization of the reference layer as determined by a parameter Q, Q being the scalar product of the unit magnetization vector of the free layer with the unit magnetization vector of the reference layer,
wherein a value of Q and the magnitude and polarity of the bias current are such that the sensor is not subject to spin-torque induced instability during operation.

32. A head as recited in claim 31, wherein a value of Q is between about zero and about −0.6.

* * * * *

UNITED STATES PATENT AND TRADEMARK OFFICE
CERTIFICATE OF CORRECTION

PATENT NO. : 7,411,765 B2
APPLICATION NO. : 11/189170
DATED : August 12, 2008
INVENTOR(S) : Childress et al.

Page 1 of 1

It is certified that error appears in the above-identified patent and that said Letters Patent is hereby corrected as shown below:

col. 2, line 39 change "(pinned)" to --(reference)--;
col. 2, line 40 change "(reference)" to --(pinned)--.

Signed and Sealed this

Second Day of June, 2009

JOHN DOLL
*Acting Director of the United States Patent and Trademark Office*